(12) United States Patent
Limaye et al.

(10) Patent No.: US 10,177,066 B2
(45) Date of Patent: Jan. 8, 2019

(54) FLEXIBLE INTEGRATED HEAT SPREADER

(71) Applicant: INTEL CORPORATION, Santa Clara, CA (US)

(72) Inventors: Ameya Limaye, Chandler, AZ (US); Shubhada Sahasrabudhe, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 15/447,559

(22) Filed: Mar. 2, 2017

(65) Prior Publication Data
US 2018/0254234 A1 Sep. 6, 2018

(51) Int. Cl.
| | | |
|---|---|---|
| H01L 23/36 | (2006.01) | |
| H01L 23/00 | (2006.01) | |
| H01L 23/31 | (2006.01) | |
| H01L 25/065 | (2006.01) | |
| H01L 25/07 | (2006.01) | |
| H01L 23/367 | (2006.01) | |
| H01L 25/04 | (2014.01) | |
| H01L 21/48 | (2006.01) | |

(52) U.S. Cl.
CPC ...... *H01L 23/3675* (2013.01); *H01L 21/4871* (2013.01); *H01L 21/4882* (2013.01); *H01L 23/315* (2013.01); *H01L 23/3121* (2013.01); *H01L 23/3164* (2013.01); *H01L 23/367* (2013.01); *H01L 24/17* (2013.01); *H01L 24/32* (2013.01); *H01L 25/042* (2013.01); *H01L 25/0652* (2013.01); *H01L 25/0655* (2013.01); *H01L 2224/0401* (2013.01); *H01L 2224/83409* (2013.01); *H01L 2224/83447* (2013.01)

(58) Field of Classification Search
CPC .......... H01L 23/367–23/3677; H01L 23/3675; H01L 23/3121; H01L 23/315; H01L 23/3164; H01L 24/17; H01L 24/32; H01L 25/0655; H01L 23/34–23/40; H01L 21/4871; H01L 21/4882; H01L 2023/4037–2023/4068; H01L 25/042; H01L 25/0652; H01L 25/072; H01L 25/0753; H01L 25/071
See application file for complete search history.

(56) References Cited

U.S. PATENT DOCUMENTS

| | | | |
|---|---|---|---|
| 2004/0052052 A1* | 3/2004 | Rivera | H01L 23/427 361/700 |
| 2005/0180113 A1* | 8/2005 | Shirakami | H01L 23/373 361/704 |
| 2017/0162550 A1* | 6/2017 | Das | H01L 25/105 |

* cited by examiner

*Primary Examiner* — Thanhha Pham
(74) *Attorney, Agent, or Firm* — Green, Howard & Mughal LLP

(57) ABSTRACT

A thermal management solution may be provided for a microelectronic system including a flexible integrated heat spreader, wherein the flexible integrated heat spreader may comprise a plurality of thermally conductive structures having a flexible thermally conductive film attached to and extending between each of the plurality of thermally conductive structures. The flexible integrated heat spreader may be incorporated into multi-chip package by providing a microelectronic substrate having a plurality of microelectronic devices attached thereto and by thermally contacting each of the plurality of thermally conductive structures of the flexible integrated heat spreader to its respective microelectronic device on the microelectronic substrate.

16 Claims, 2 Drawing Sheets

FLEXIBLE INTEGRATED HEAT SPREADER

TECHNICAL FIELD

Embodiments of the present description generally relate to the removal of heat from multiple microelectronic devices, and, more particularly, to thermal management solutions wherein a single integrated heat spreader may be used to remove heat from multiple microelectronic devices, while compensating for differing thicknesses or heights between the microelectronic devices.

BACKGROUND

Higher performance, lower cost, increased miniaturization of integrated circuit components, and greater packaging density of integrated circuits are ongoing goals of the microelectronic industry. As these goals are achieved, microelectronic devices become smaller. Accordingly, the density of power consumption of the integrated circuit components in the microelectronic devices has increased, which, in turn, increases the average junction temperature of the microelectronic device. If the temperature of the microelectronic device becomes too high, the integrated circuits of the microelectronic device may be damaged or destroyed. This issue becomes even more critical when multiple microelectronic devices are incorporated in close proximity to one another on a microelectronic substrate in a multiple microelectronic device package, also known as a multi-chip package. Thus, thermal transfer solutions, such as integrated heat spreaders, must be utilized to remove heat from the microelectronic devices. However, significant issues with removing heat are due to thickness differences between the microelectronic devices, warpage in the microelectronic substrate, and planarity of the integrated heat spreader. All these variations manifest themselves as variations in the thickness of a thermal interface material that is disposed between the integrated heat spreader and each microelectronic device. As will be understood to those skilled in the art, thick thermal interface materials add thermal resistance to the heat transfer from the microelectronic devices to the integrated heat spreader and, thereby, reduce the thermal performance of the multi-chip package.

Currently, the variations are accommodated with a compromise between the thermal performances of the various microelectronic devices in the multi-chip package. This is achieved by identifying most thermally critical microelectronic device, then the integrated heat spreader is designed in such a way as to bottom-out (touch or otherwise minimize the distance between the most thermally critical microelectronic device and the integrated heat spreader) on the most thermally critical microelectronic device. A cavity or a pedestal may be fabricated inside the integrated heat spreader to ensure that it bottoms-out on the most thermally critical microelectronic device. This can result in thicker thermal interface material layers on all the other microelectronic devices in the multi-chip package, which may degrade their heat dissipation. Thus, thermal performance on one microelectronic device is achieved at the expense of the thermal performance on other microelectronic devices in the multi-chip package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
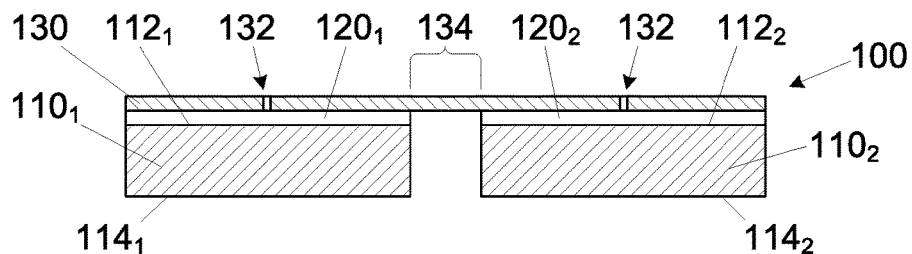
FIG. 1 is a side cross-sectional view of a flexible integrated heat spreader, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to thermal solutions for microelectronic systems comprising a flexible integrated heat spreader, wherein the flexible integrated heat spreader may comprise a plurality of thermally conductive structures having a flexible thermally conductive film attached to and extending between each of the plurality of thermally conductive structures. The flexible integrated heat spreader may be incorporated into multi-chip package by providing a microelectronic substrate having a plurality of microelectronic devices attached thereto and by thermally contacting each of the plurality of thermally conductive structures of the flexible integrated heat spreader to its respective microelectronic device on the microelectronic substrate.

FIG. 1 illustrates a heat dissipation device, such as a flexible integrated heat spreader 100, according to one embodiment of the present description. The flexible integrated heat spreader 100 may comprise a plurality of thermally conductive structures, illustrated as a first thermally conductive structure $110_1$ and a second thermally conductive structure $110_2$. Each thermally conductive structure $110_1$ and $110_2$ may include a first surface $112_1$ and $112_2$, respectively, and an opposing second surface $114_1$ and $114_2$. A flexible thermally conductive foil 130 may be attached to and extend between each of the thermally conductive structures $110_1$ and $110_2$. As illustrated, the flexible thermally conductive foil 130 may be attached to the first surfaces $112_1$ and $112_2$ of the thermally conductive structures $110_1$ and $110_2$ with a thermally conductive adhesion material $120_1$ and $120_2$, respectively. Furthermore, a portion 134 of the flexible thermally conductive foil 130 may extend between the plurality of thermally conductive structures $110_1$ and $110_2$ without being attached thereto. In one embodiment of the present description, the flexible thermally conductive foil 130 will be sufficient to allow the portion 134 thereof to flex or deform to compensate for thicknesses or height variations in a microelectronic system, as will be discussed.

The plurality of thermally conductive structures $110_1$ and $110_2$ may be made of any appropriate thermally conductive material, such a metals and alloys, including, but not limited to, copper, aluminum, and the like, and may be formed by any known process, including, but not limited to, stamping or machining. The flexible thermally conductive foil 130 may be any appropriate size and thickness, may be made of any appropriate thermally conductive material, such a metals and alloys, including, but not limited to, copper, aluminum, and the like, and may be formed by any known process, including, but not limited to, stamping followed by machining. In a specific embodiment, the flexible thermally conductive foil 130 may be made of copper and have a thickness of about 100 μm.

The thermally conductive adhesion material $120_1$ and $120_2$ may be any appropriate material, including, but not limited to, metal-based adhesion materials. In one embodiment of the present description, the thermally conductive adhesion material $120_1$ and $120_2$ may comprise a solder material, wherein the solder material and a flux material are reflowed, either by heat, pressure, and/or sonic energy, between the plurality of thermally conductive structures $110_1$ and $110_2$ and the flexible thermally conductive foil 130. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When a solder material is used as the thermally conductive adhesion material $120_1$ and $120_2$, at least one vent hole 132 may be formed through the flexible thermally conductive foil 130 to allow degassing of the flux material to prevent voids forming in the thermally conductive adhesion material $120_1$ and $120_2$. In another embodiment of the present description, the thermally conductive adhesion material $120_1$ and $120_2$ may be indium, wherein sheets of indium may be placed between the plurality of thermally conductive structures $110_1$ and $110_2$ and the flexible thermally conductive foil 130, then pressure can be application to create a joint between the plurality of thermally conductive structures $110_1$ and $110_2$ and the flexible thermally conductive foil 130 in a process known as "cold-forming".

Figure 2:
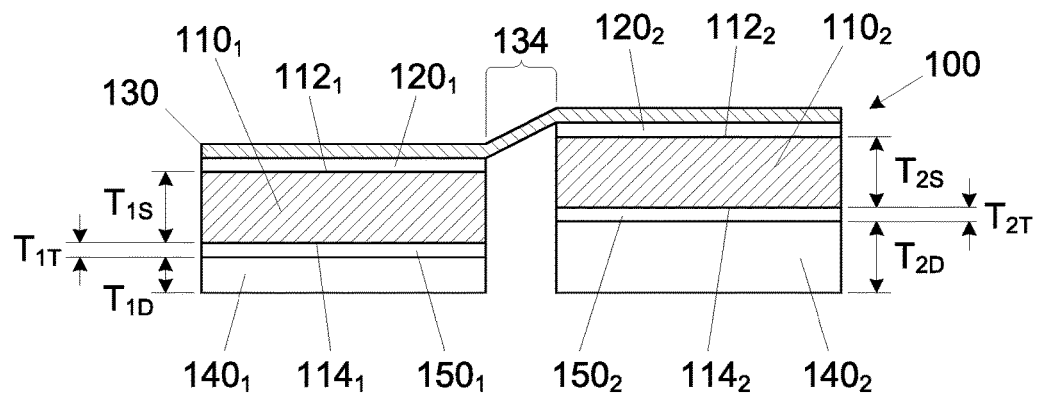
FIG. 2 is a side cross-sectional view of the flexible integrated heat spreader of FIG. 1 in thermal contact with a plurality of microelectronic devices, according to an embodiment of the present description.

FIG. 2 illustrates the heat dissipation device, such as the flexible integrated heat spreader 100 of FIG. 1, placed in thermal contact with a plurality of microelectronic devices, such as a first microelectronic device $140_1$ and a second microelectronic device $140_2$. Each of the microelectronic devices, such as a first microelectronic device $140_1$ and a second microelectronic device $140_2$, may be may be any appropriate device including by not limited to microprocessors, chipsets, graphics devices, wireless devices, memory devices, application specific integrated circuits, combinations thereof, stacks thereof, or the like.

As illustrated in FIG. 2, each of the plurality of thermally conductive structures $110_1$ and $110_2$ may be sized to correspond with its respective microelectronic device $140_1$ and $140_2$. Additionally, each thermally conductive structure $110_1$ and $110_2$ may have a thickness $T_{1S}$ and $T_{2S}$, respectively. The thickness $T_{1S}$ of the first thermally conductive structure $110_1$ is defined between the first surface $112_1$ and the opposing second surface $114_1$ of the first thermally conductive structure $110_1$, and the thickness $T_{2S}$ of the second thermally conductive structure $110_2$ is defined between the first surface $112_2$ and the opposing second surface $114_2$ of the second thermally conductive structure $110_2$. In one embodiment of the present description, the thermally conductive structures $110_1$ and $110_2$ may be formed to have substantially equal thicknesses $T_{1S}$ and $T_{2S}$, respectively.

As further shown in FIG. 2, the second surface $114_1$ and $114_2$ of each of the plurality of thermally conductive structures $110_1$ and $110_2$, respectively, may be in thermal contact with its corresponding microelectronic device $140_1$ and $140_2$. To facilitate heat removal, a thermal interface material, such as a thermally conductive grease or adhesive, may be disposed between the thermally conductive structures $110_1$ and $110_2$ and their corresponding microelectronic devices $140_1$ and $140_2$. As illustrated, a first thermal interface material $150_1$ may be disposed between the second surface $114_1$ of the first thermally conductive structure $110_1$ and its corresponding microelectronic device $140_1$, and a second thermal interface material $150_2$ may be disposed between the second surface $114_2$ of the second thermally conductive structure $110_2$ and its corresponding microelectronic device $140_2$. As previously discussed, the thermal interface material $150_1$ and $150_2$ should be as thin as possible to minimize thermal resistance and may have substantially equal thicknesses $T_{1T}$ and $T_{2T}$.

As further illustrated in FIG. 2, the first microelectronic device $140_1$ may have a thickness $T_{1D}$, which differs from a thickness $T_{2D}$ of the second microelectronic device $140_2$. Thus, to compensate for the differing thicknesses $T_{1D}$ and $T_{2D}$ of the microelectronic devices $140_1$ and $140_2$, the portion 134 of the flexible thermally conductive foil 130 between the microelectronic devices $140_1$ and $140_2$ will flex or otherwise deform, which allows the thermal interface material $150_1$ and $150_2$ to have small thicknesses $T_{1T}$ and $T_{2T}$, respectively. As will be understood to those skilled in the art, if the portion 134 of the flexible thermally conductive foil 130 did not flex, the differing thicknesses $T_{1D}$ and $T_{2D}$ of the microelectronic devices $140_1$ and $140_2$, respectively, would have to be compensated for by increasing the thickness $T_{1T}$ of the first thermal interface material $150_1$, which may decrease the efficiency of heat removal from the first microelectronic device $140_1$.

Figure 3:
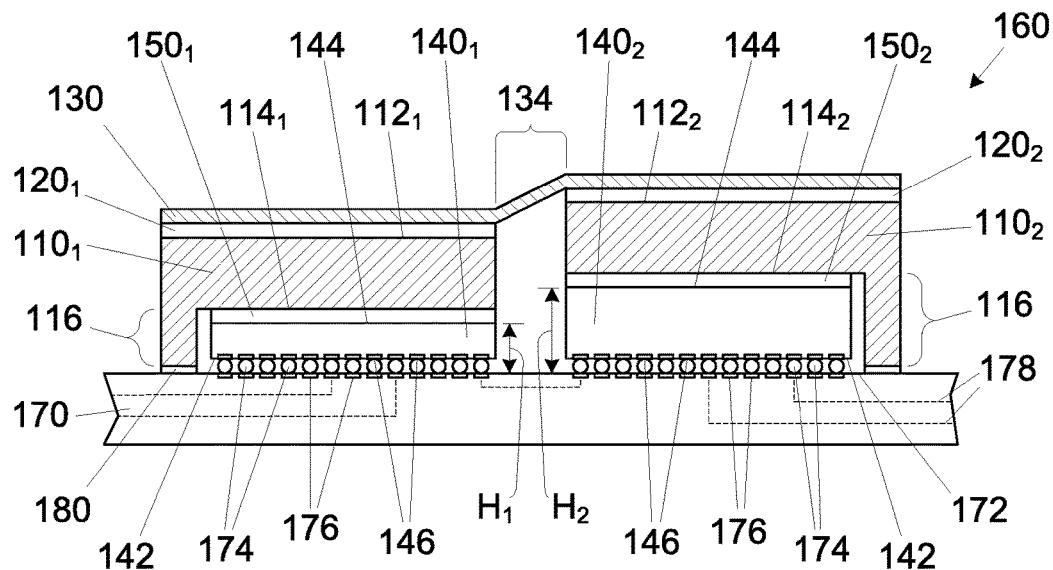
FIG. 3 is a side cross-sectional view of a microelectronic system including the flexible integrated heat spreader in thermal contact with a plurality of microelectronic devices attached to a microelectronic substrate, according to an embodiment of the present description.

FIG. 3 illustrates microelectronic package 160 having multiple microelectronic devices mounted to a microelectronic substrate and coupled with a flexible integrated heat spreader. As shown in FIG. 3, a microelectronic package 160 may comprise the plurality of microelectronic devices (such as the first microelectronic device $140_1$ and the second microelectronic device $140_2$) attached to a first surface 172 of a microelectronic substrate 170, such as a printed circuit board, a motherboard, and the like, through a plurality of interconnects 174, such as reflowable solder bumps or balls, in a configuration generally known as a flip-chip or controlled collapse chip connection ("C4") configuration. The device-to-substrate interconnects 174 may extend from bond pads 146 on an active surface 142 of each of the microelectronic devices $140_1$ and $140_2$ and bond pads 176 on the microelectronic substrate first surface 172. The microelectronic device bond pads 146 of each of the microelectronic devices $140_1$ and $140_2$ may be in electrical communication with integrated circuitry (not shown) within the microelectronic devices $140_1$ and $140_2$. The microelectronic substrate 170 may include at least one conductive route 178 extending therethrough from at least one microelectronic substrate bond pad 176 to external components (not shown) and/or between at least two microelectronic substrate bond pads 176.

As illustrated in FIG. 3, the microelectronic devices $140_1$ and $140_2$ may have differing heights $H_1$ and $H_2$, respectively, (i.e. the distance between the microelectronic substrate first surface 172 and a back surface 144 of each microelectronic device $140_1$ and $140_2$). The difference in the heights $H_1$ and $H_2$ may be a result of the first microelectronic device $140_1$ having thickness $T_{1D}$ (see FIG. 2), which differs from thickness $T_{2D}$ (see FIG. 2) of the second microelectronic device $140_2$ and/or due to warpage (not shown) in the microelectronic substrate 170. Thus, to compensate for the differing heights $H_1$ and $H_2$ of the microelectronic devices $140_1$ and $140_2$, the portion 134 of the flexible thermally conductive foil 130 between the microelectronic devices $140_1$ and $140_2$ will flex, which allows the thermal interface material $120_1$ and $120_2$ to have small thicknesses $T_{1T}$ and $T_{2T}$, respectively.

As illustrated in FIG. 3, at least one of the first thermally conductive structure $110_1$ and the second thermally conductive structure $110_2$ may include at least one footing 116. The footing(s) 116 may extend from the first thermally conductive structure $110_1$ and/or the second thermally conductive structure $110_2$ toward the microelectronic substrate 170, and may be attached to the microelectronic substrate first surface 172 with a sealant or adhesive material 180.

The microelectronic substrate 170 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The microelectronic substrate conductive routes 178 may be composed of any conductive material, including but not limited to metals, such as copper and aluminum, and alloys thereof. As will be understood to those skilled in the art, the microelectronic substrate conductive routes 178 may be formed as a plurality of conductive traces (not shown) formed on layers of dielectric material (constituting the layers of the microelectronic substrate material), which are connected by conductive vias (not shown).

The device-to-substrate interconnects 174 can be made of any appropriate material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the microelectronic devices $140_1$ an $140_2$ are attached to the microelectronic substrate 170 with device-to-substrate interconnects 174 made of solder, the solder is reflowed, either by heat, pressure, and/or sonic energy, to secure the solder between the microelectronic device bond pads 146 and the microelectronic substrate bond pads 176.

It can be seen from the embodiments of the present description, the flexible integrated heat spreader can accommodate the variation in every microelectronic device thickness and/or height in a multi-chip package by bringing each thermally conductive structure as close as possible to it respective microelectronic device, e.g. "bottoming-out". This, of course, may result in a minimum thermal interface thickness on every microelectronic device, regardless of the number of microelectronic devices, which may have differing thicknesses and/or heights. Thus, the embodiments of the flexible integrated heat spreader may significantly improve the thermal performance of such a multi-chip package. In addition, the various embodiments of the flexible integrated heat spreader may result in a structural de-coupling between each of the microelectronic devices and, thereby, may reduce the degradation of the thermal interface material during reliability testing, as will be understood to those skilled in the art. Moreover, the modularity of the thermally conductive structures may help in minimizing the numbers parts and tooling for various multi-chip packages.

In a further embodiment of the present description, the placement of the flexible integrated heat spreader may comprise attaching the plurality of microelectronic devices on the microelectronic substrate followed by dispensing the thermal interface material on each of the microelectronic devices, and, optionally, dispensing the adhesive material for the thermally conductive structure footings on the microelectronic substrate. A pick and place tool with multiple heads may be used to place the flexible integrated heat spreader. The pick and place heads may be force-controlled to ensure that every thermally conductive structure bottoms-out on its respective microelectronic device. In this process, the flexible thermally conductive foil will deform and accommodate the different thicknesses and/or heights, as previously discussed. The multi-chip package may then undergo a heating step that may cure the thermal interface material between the microelectronic devices and the thermally conductive structures, and may also cure the adhesive material between the microelectronic substrate and the footings of the thermally conductive structures.

Figure 4:
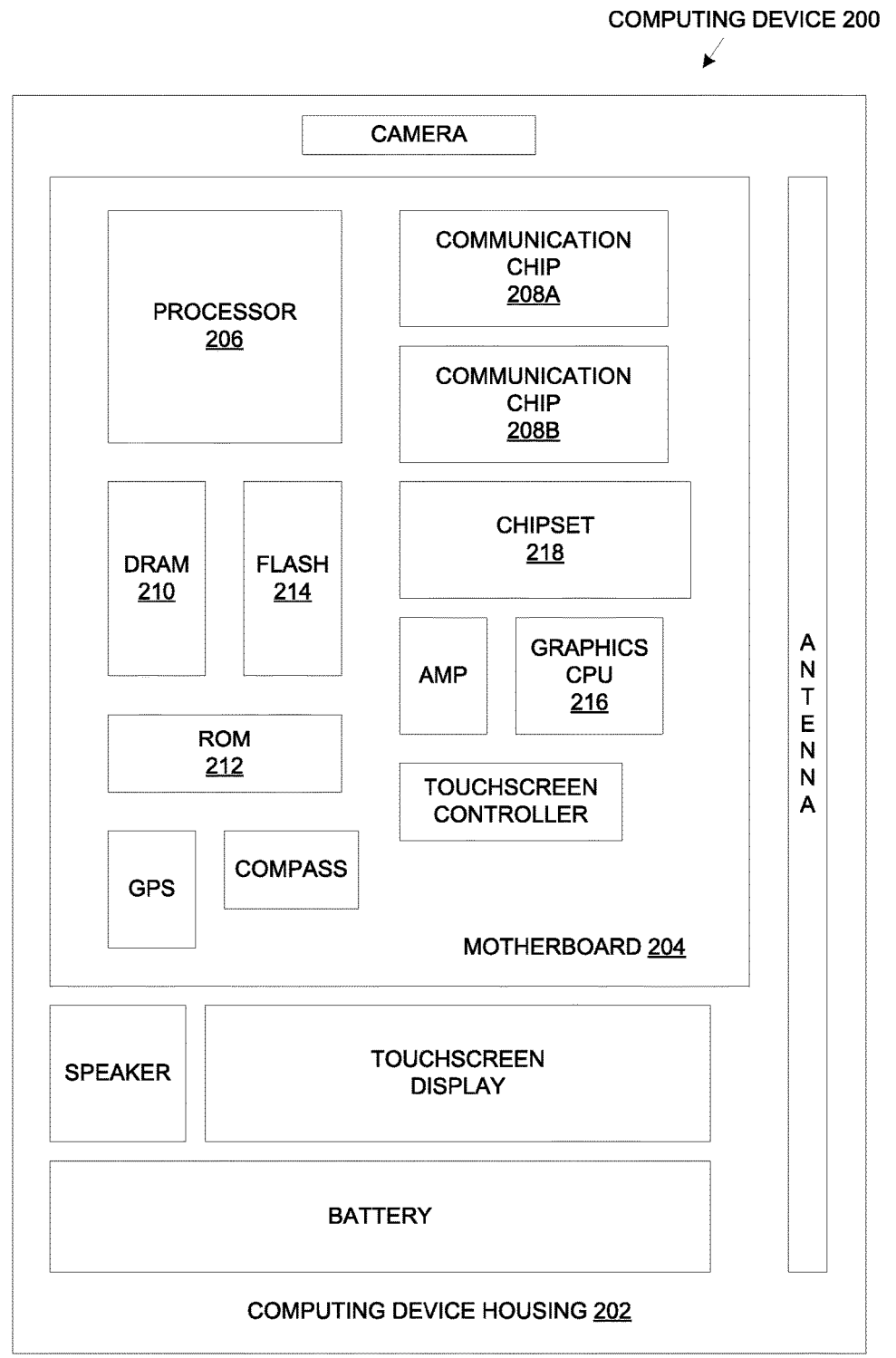
FIG. 4 is an electronic device/system, according to an embodiment of the present description.

FIG. 4 illustrates an electronic or computing device 200 in accordance with one implementation of the present description. The computing device 200 includes a computing device housing 202 houses a board 204. The board may include a number of microelectronic components, including but not limited to a processor 206, at least one communication chip 208A, 208B, volatile memory 210 (e.g., DRAM), non-volatile memory 212 (e.g., ROM), flash memory 214, a graphics processor or CPU 216, a digital signal processor (not shown), a crypto processor (not shown), a chipset 218, an antenna, a display, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the microelectronic components may be physically and electrically coupled to the board 204. In some implementations, at least one of the microelectronic components may be a part of the processor 206.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the microelectronic components may include a plurality of microelectronic devices with a heat dissipation device in thermal contact with the plurality of microelectronic devices, wherein the flexible heat spreader may comprise a plurality of thermally conductive structures and a flexible thermally conductive foil, wherein the flexible thermally conductive foil is attached to and extends between each of the thermally conductive structures of the plurality of thermally conductive structures and wherein each of the plurality of thermally conductive structures of the heat dissipation device is in thermal contact with a corresponding microelectronic device of the plurality of microelectronic devices.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-4. The subject matter may be applied to other microelectronic devices and assembly applications, as well as any appropriate electronic application, as will be understood to those skilled in the art.

The following examples pertain to further embodiments, wherein Example 1 is a heat dissipation device, comprising a plurality of thermally conductive structures and a flexible thermally conductive foil, wherein the flexible thermally conductive foil is attached to each of the thermally conductive structures of the plurality of thermally conductive structures and wherein a portion of the flexible thermally conductive foil extends between each of the plurality of thermally conductive structure.

In Example 2, the subject matter of Example 1 can optionally include a thermally conductive adhesive material disposed between the flexible thermally conductive foil and each of the thermally conductive structures of the plurality of thermally conductive structures.

In Example 3, the subject matter of Example 2 can optionally include the thermally conductive adhesive material comprising a solder material.

In Example 4, the subject matter of Example 2 can optionally include the thermally conductive adhesive material comprising indium.

In Example 5, the subject matter of any of Examples 1 to 4 can optionally include the flexible thermally conductive foil comprising copper.

In Example 6, the subject matter of any of Examples 1 to 4 can optionally include at least one thermally conductive structure of the plurality of thermally conductive structures further comprising a footing extending therefrom.

The following examples pertain to further embodiments, wherein Example 7 is a microelectronic package, comprising forming a microelectronic substrate, a plurality of microelectronic devices attached to the microelectronic substrate, and a heat dissipation device comprising a plurality of thermally conductive structures and a flexible thermally conductive foil, wherein the flexible thermally conductive foil is attached to each of the thermally conductive structures of the plurality of thermally conductive structures and wherein a portion of the flexible thermally conductive foil extends between each of the plurality of thermally conductive structure, wherein each of the plurality of thermally conductive structures of the heat dissipation device is in thermal contact with a corresponding microelectronic device of the plurality of microelectronic devices.

In Example 8, the subject matter of Example 7 can optionally include a height of a first microelectronic device of the plurality of microelectronic devices differing from a height of a second microelectronic device of the plurality of microelectronic devices.

In Example 9, the subject matter of Example 8 can optionally include a portion of the flexible thermally conductive foil extending between each of the thermally conductive structure of the plurality of thermally conductive structures being deformed to compensate for the difference between the height of the first microelectronic device and the height of the second microelectronic device.

In Example 10, the subject matter of any of Examples 7 to 9 can optionally include a thermal interface material disposed between at least one thermally conductive structure of the plurality of thermally conductive structures and at least one microelectronic device of the plurality of microelectronic devices.

In Example 11, the subject matter of any of Examples 7 to 9 can optionally include the heat dissipation device further comprising a thermally conductive adhesive material disposed between the flexible thermally conductive foil and each of the thermally conductive structures of the plurality of thermally conductive structures.

In Example 12, the subject matter of Example 11 can optionally include the thermally conductive adhesive material comprising a solder material.

In Example 13, the subject matter of Example 11 can optionally include the thermally conductive adhesive material comprising indium.

In Example 14, the subject matter of any of Examples 7 to 9 can optionally include the flexible thermally conductive foil comprising copper.

In Example 15, the subject matter of any of Examples 7 to 9 can optionally include at least one thermally conductive structure of the plurality of thermally conductive structures further comprising a footing extending therefrom.

In Example 16, the subject matter of Example 15 can optionally include the footing being attached to a first surface of the microelectronic substrate.

The following examples pertain to further embodiments, wherein Example 17 is an electronic system, comprising a housing, a microelectronic substrate disposed within the housing, a plurality of microelectronic devices attached to the microelectronic substrate, and a heat dissipation device comprising a plurality of thermally conductive structures and a flexible thermally conductive foil, wherein the flexible thermally conductive foil is attached to each of the thermally conductive structures of the plurality of thermally conductive structures and wherein a portion of the flexible thermally conductive foil extends between each of the plurality of thermally conductive structure, wherein each of the plurality of thermally conductive structures of the heat dissipation device is in thermal contact with a corresponding microelectronic device of the plurality of microelectronic devices.

In Example 18, the subject matter of Example 17 can optionally include a height of a first microelectronic device of the plurality of microelectronic devices differing from a height of a second microelectronic device of the plurality of microelectronic devices.

In Example 19, the subject matter of Example 18 can optionally include a portion of the flexible thermally conductive foil extending between each of the thermally conductive structure of the plurality of thermally conductive structures being deformed to compensate for the difference between the height of the first microelectronic device and the height of the second microelectronic device.

In Example 20, the subject matter of any of Examples 17 to 19 can optionally include a thermal interface material disposed between at least one thermally conductive structure of the plurality of thermally conductive structures and at least one microelectronic device of the plurality of microelectronic devices.

In Example 21, the subject matter of any of Examples 17 to 19 can optionally include the heat dissipation device further comprising a thermally conductive adhesive material disposed between the flexible thermally conductive foil and each of the thermally conductive structures of the plurality of thermally conductive structures.

In Example 22, the subject matter of Example 21 can optionally include the thermally conductive adhesive material comprising a solder material.

In Example 23, the subject matter of Example 21 can optionally include the thermally conductive adhesive material comprising indium.

In Example 24, the subject matter of any of Examples 17 to 19 can optionally include the flexible thermally conductive foil comprising copper.

In Example 25, the subject matter of any of Examples 17 to 19 can optionally include at least one thermally conductive structure of the plurality of thermally conductive structures further comprising a footing extending therefrom.

In Example 26, the subject matter of Example 25 can optionally include the footing being attached to a first surface of the microelectronic substrate.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic substrate;
   a plurality of microelectronic devices attached to the microelectronic substrate; and
   a heat dissipation device comprising a plurality of thermally conductive structures and a flexible thermally conductive foil, wherein the flexible thermally conductive foil is attached to each of the thermally conductive structures of the plurality of thermally conductive structures, wherein a portion of the flexible thermally conductive foil extends between each of the plurality of thermally conductive structure, wherein at least one thermally conductive structure of the plurality of thermally conductive structures further comprises a footing extending therefrom, and wherein the footing is attached to a first surface of the microelectronic substrate;
   wherein each of the plurality of thermally conductive structures of the heat dissipation device is in thermal contact with a corresponding microelectronic device of the plurality of microelectronic devices.

2. The microelectronic package of claim 1, wherein a height of a first microelectronic device of the plurality of microelectronic devices differs from a height of a second microelectronic device of the plurality of microelectronic devices.

3. The microelectronic package of claim 2, wherein a portion of the flexible thermally conductive foil extending between each of the thermally conductive structure of the plurality of thermally conductive structures is deformed to compensate for the difference between the height of the first microelectronic device and the height of the second microelectronic device.

4. The microelectronic package of claim 1, further comprising a thermal interface material disposed between at least one thermally conductive structure of the plurality of thermally conductive structures and at least one microelectronic device of the plurality of microelectronic devices.

5. The microelectronic package of claim 1, wherein the heat dissipation device further comprises a thermally conductive adhesive material disposed between the flexible thermally conductive foil and each of the thermally conductive structures of the plurality of thermally conductive structures.

6. The microelectronic package of claim 5, wherein the thermally conductive adhesive material comprises a solder material.

7. The microelectronic package of claim 5, wherein the thermally conductive adhesive material comprises indium.

8. The microelectronic package of claim 1, wherein the flexible thermally conductive foil comprises copper.

9. An electronic system, comprising:
   a housing;

a microelectronic substrate disposed within the housing;

a plurality of microelectronic devices attached to the microelectronic substrate; and a heat dissipation device comprising a plurality of thermally conductive structures and a flexible thermally conductive foil, wherein the flexible thermally conductive foil is attached to each of the thermally conductive structures of the plurality of thermally conductive structures, wherein a portion of the flexible thermally conductive foil extends between each of the plurality of thermally conductive structure, wherein at least one thermally conductive structure of the plurality of thermally conductive structures further comprises a footing extending therefrom, and wherein the footing is attached to a first surface of the microelectronic substrate;

wherein each of the plurality of thermally conductive structures of the heat dissipation device is in thermal contact with a corresponding microelectronic device of the plurality of microelectronic devices.

10. The electronic system of claim 9, wherein a height of a first microelectronic device of the plurality of microelectronic devices differs from a height of a second microelectronic device of the plurality of microelectronic devices.

11. The electronic system of claim 10, wherein a portion of the flexible thermally conductive foil extending between each of the thermally conductive structure of the plurality of thermally conductive structures is deformed to compensate for the difference between the height of the first microelectronic device and the height of the second microelectronic device.

12. The electronic system of claim 9, further comprising a thermal interface material disposed between at least one thermally conductive structure of the plurality of thermally conductive structures and at least one microelectronic device of the plurality of microelectronic devices.

13. The electronic system of claim 9, wherein the heat dissipation device further comprises a thermally conductive adhesive material disposed between the flexible thermally conductive foil and each of the thermally conductive structures of the plurality of thermally conductive structures.

14. The electronic system of claim 13, wherein the thermally conductive adhesive material comprises a solder material.

15. The electronic system of claim 13, wherein the thermally conductive adhesive material comprises indium.

16. The electronic system of claim 9, wherein the flexible thermally conductive foil comprises copper.

\* \* \* \* \*